(12) United States Patent
Lee et al.

(10) Patent No.: US 7,418,780 B2
(45) Date of Patent: Sep. 2, 2008

(54) METHOD FOR FORMING STACKED VIA-HOLES IN A MULTILAYER PRINTED CIRCUIT BOARD

(75) Inventors: Wen-Chin Lee, Taoyuan (TW); Cheng-Hsien Lin, Taoyuan (TW)

(73) Assignee: Foxconn Advanced Technology Inc., Tayuan, Taoyuan (TW)

( * ) Notice: Subject to any disclaimer, the term of this patent is extended or adjusted under 35 U.S.C. 154(b) by 26 days.

(21) Appl. No.: 11/560,787

(22) Filed: Nov. 16, 2006

(65) Prior Publication Data

US 2007/0266559 A1 Nov. 22, 2007

(30) Foreign Application Priority Data

May 19, 2006 (TW) .................................. 95117887

(51) Int. Cl.
*H01K 3/10* (2006.01)
*H05K 3/36* (2006.01)
(52) U.S. Cl. .............................. 29/852; 29/825; 29/830; 29/846; 219/121.71; 427/97.1
(58) Field of Classification Search .................. 29/825, 29/830, 846, 852; 219/121.71; 427/97.1
See application file for complete search history.

(56) References Cited

U.S. PATENT DOCUMENTS

| 5,826,330 | A | * | 10/1998 | Isoda et al. | 29/852 |
| 6,021,564 | A | * | 2/2000 | Hanson | 29/852 |
| 6,023,041 | A | * | 2/2000 | Noddin | 219/121.71 |
| 6,103,992 | A | * | 8/2000 | Noddin | 219/121.71 |
| 6,132,853 | A | * | 10/2000 | Noddin | 428/209 |
| 6,203,891 | B1 | * | 3/2001 | Noddin | 428/209 |
| 6,407,363 | B2 | * | 6/2002 | Dunsky et al. | 219/121.71 |
| 2005/0099785 | A1 | | 5/2005 | Chang | |

* cited by examiner

*Primary Examiner*—C. J Arbes

(57) ABSTRACT

An exemplary method for forming stacked via-holes in a multilayer printed circuit board includes the steps of: providing a base circuit board; attaching a first copper-coated-substrate having a first substrate and a first copper layer thereon and a second copper-coated-substrate having a second substrate and a second copper layer thereon onto the base circuit board in a manner such that; forming at least one first window in the second copper layer, making at least one first hole in the second substrate through the at least one first window, forming at least one second window in the first copper layer through the at least one first hole, and making at least one second hole in the first substrate through the at least one second window, thus forming at least one part-finished stacked via-hole; and plating the at least one part-finished stacked via-hole thereby forming at least one stacked via-hole.

15 Claims, 21 Drawing Sheets

METHOD FOR FORMING STACKED VIA-HOLES IN A MULTILAYER PRINTED CIRCUIT BOARD

TECHNICAL FIELD

The present invention generally relates to multilayer printed circuit boards, and more particularly relates to a method for forming stacked via-holes in a multilayer printed circuit board.

BACKGROUND

With the development of science and technology, microphones, portable computers and other electronic products have achieved ever greater levels of miniaturization. In order to accommodate these products, inter-layer structure of multilayer printed circuit boards has become more and more complicated, thereby leading to the development of high-density interconnection (HDI) technology using via-holes.

Via-holes refer to plated holes that connect conductive traces from one layer to other layers of a multilayer printed circuit board. Via-holes facilitate HDI of multilayer printed circuit boards. Via-holes generally include blind vias, buried vias or through-hole vias. Blind vias are usually used for connecting the conductive traces from an outer layer to an inner layer of a multilayer printed circuit board. Buried vias are usually used for connecting the conductive traces between inner layers of a multilayer printed circuit board. Through-hole vias are usually used for connecting the conductive traces on each layer of a multilayer printed circuit board. In HDI technology, referring to FIG. 3, a typical blind via with stepped structure is shown. Because the blind via is formed by two vias with different diameters stacked together, blind vias like this are generally called stacked via-holes.

Referring to FIGS. 4A-4G, as an example, a method for forming stacked via-holes in multilayer printed circuit boards generally includes the steps of: firstly, referring to FIG. 4A, applying a substrate 100, which includes a base film 101 and two conductive layers 102 onto two opposite surfaces of the base film 101 thus forming conductive traces; secondly, referring to FIG. 4B, attaching a first film 110 onto each of the two conductive layers 102, each first film 110 including a first resin layer 114 and a first conductive layer 112 thereon, the first resin layer contacting with the conductive layer 102; thirdly, referring to FIG. 4C, forming a number of first windows 130 at predetermined positions of the first conductive layer 112 using a photolithographic process; fourthly, referring to FIG. 4D, attaching a second film 120 on each of the two first films 110, each second film 120 including a second resin layer 124 and a second conductive layer 122 thereon, the second resin layer 124 contacting with the first conductive layer 112; fifthly, referring to FIG. 4E, forming a number of second windows 140 with larger diameters in different positions of the second conductive layer 122 corresponding to the first windows 130 using a photolithographic process; sixthly, referring to FIG. 4F, removing the second resin layer 124 corresponding to the second windows 140 and the first resin layer 114 corresponding to the first windows 130 using a carbon dioxide laser to form a number of stacked via-holes 150; finally, referring to FIG. 4G, plating the stacked via-holes 150 to connect the conductive traces.

However, the typical method for forming stacked via-holes 150 in the multilayer printed circuit board described above has the following disadvantages. First of all, because formation of the second windows 140 is based on formation of the first windows 130, the first windows 130 in the first film 110 and the second windows 140 in the second film 120 can undergo positional excursion, thereby affecting precision of the stacked via-holes 150. Secondly, during formation of the first windows 130 and the second windows 140, the photolithographic process used many times can suffer from increasing system error. Thirdly, the laser treatment is used only once, simultaneously removing both the first resin layer 124 corresponding to the first window 130 and the second resin layer 124 corresponding to the second windows 140, so the strength of the laser cannot be adjusted according to windows with different diameters and resins with different characteristics. Referring to FIGS. 5A and 5B, different views of a typical poorly-made stacked via-hole formed due to above-described reasons are shown. The poorly-made stacked via-hole can cause potential short circuits, thereby affecting quality of final products.

What is needed, therefore, is a method for forming stacked via-holes in multilayer printed circuit boards to improve quality of the stacked via-holes.

SUMMARY

One preferred embodiment provides a method for forming stacked via-holes in a multilayer printed circuit board. The method includes the steps of: providing a base circuit board having conductive traces; attaching a first copper-coated-substrate having a first substrate and a first copper layer thereon and a second copper-coated-substrate having a second substrate and a second copper layer thereon onto the base circuit board in a manner such that the first substrate is brought into contact with the base circuit board and the second substrate is brought into contact with the first copper layer; forming at least one first window in the second copper layer thereby yielding a residual second copper layer; forming a protective layer on the residual second copper layer; making at least one first hole in the second substrate through the at least one first window using a first laser treatment; forming at least one second window in the first copper layer through the at least one first hole; removing the protective layer; making at least one second hole in the first substrate through the at least one second window using a second laser treatment, thus allowing the at least one first window, the at least one first hole, the at least one second window and the at least one second hole to cooperatively form at least one part-finished stacked via-hole; and plating a metal layer on an inner surface of the at least one part-finished stacked via-hole thereby forming at least one stacked via-hole.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of embodiments. Moreover, in the drawings, like reference numerals designate corresponding parts throughout the different views.

DETAILED DESCRIPTION OF PREFERRED EMBODIMENT

An embodiment will now be described in detail below and with reference to the drawings.

Referring to FIG. 1A-1I, a method for forming stacked via-holes in a multilayer printed circuit board includes the following steps.

Figure 1A:
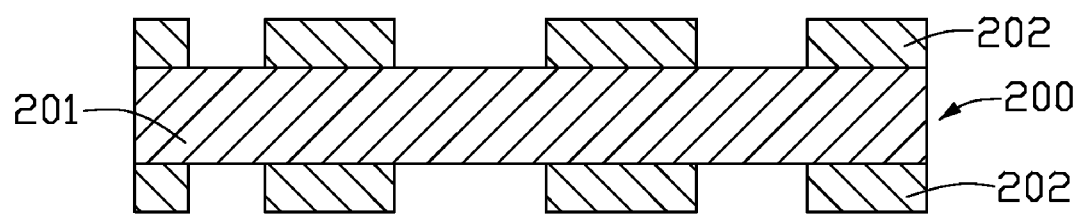
FIGS. 1A-1I are schematic views of successive stages of a method for forming stacked via-holes in a multilayer printed circuit board according to a preferred embodiment.

Step 1: referring to FIG. 1A, a base circuit board 200 is provided. The base circuit board 200 can be a single-layer structure or a multilayer structure containing two layers, four layers, six layers or more. In the embodiment, the base circuit board 200 is a single-layer two-side structure and includes a substrate 201 and two metal films 202 formed on two opposite surfaces of the substrate 201. Conductive traces can be formed on each metal film 202. In the embodiment, the metal film 202 can consist of copper.

Figure 1B:
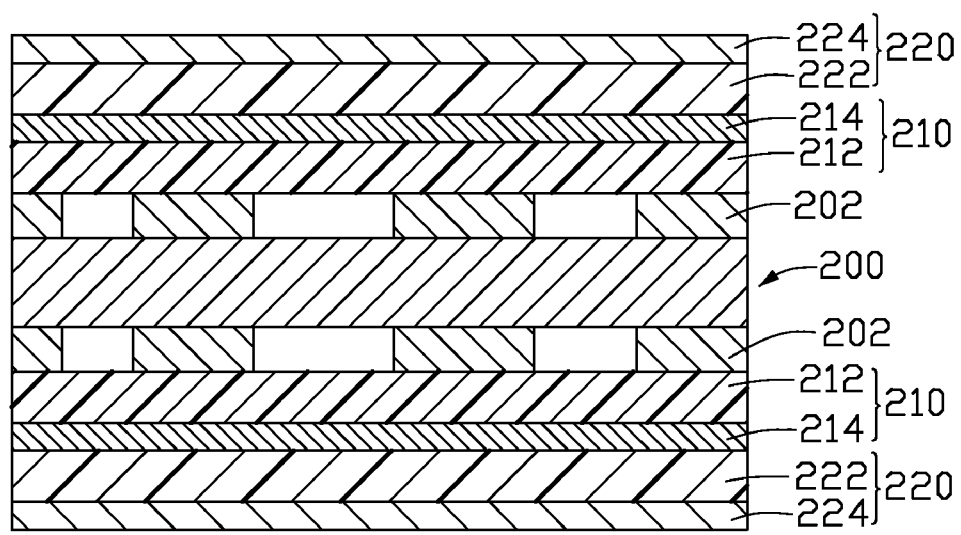

Step 2: referring to FIG. 1B, a first copper-coated-substrate 210 and a second copper-coated-substrate 220 are attached onto the two metal films 202 of the base circuit board 200 on top of each other in that order. The first copper-coated-substrate 210 includes a first substrate 212 brought into contact with the copper film 202 of the base circuit board 200 and a first copper layer 214 on the first substrate 212. The second copper-coated-substrate 220 includes a second substrate 222 brought into contact with the first copper layer 214 and a second copper layer 224 on the second substrate 222. Therefore, the second copper-coated-substrate 220 is an outermost layer and the first copper-coated-substrate 210 is a sub-outer layer of a preformed multilayer printed circuit board. The first copper-coated-substrate 210 and the second copper-coated-substrate 220 can only be attached to one metal film 202 having the conductive traces.

The first copper-coated-substrate 210 and the second copper-coated-substrate 220 can be selected from a group consisting of resin coated copper foil and prepreg copper-clad foil. Resin coated copper foil is generally produced by applying a resin varnish to an ultra-thin copper foil and drying the same. Prepreg is an insulative reinforcement material such as, for example, fibreglass fabric impregnated with epoxy resin. Laminating a copper foil onto a prepreg can form a prepreg copper-clad foil. Therefore, resin coated copper foil or prepreg copper-clad foil usually includes a resin layer used for insulation and a copper layer used for electric conduction.

Figure 1C:
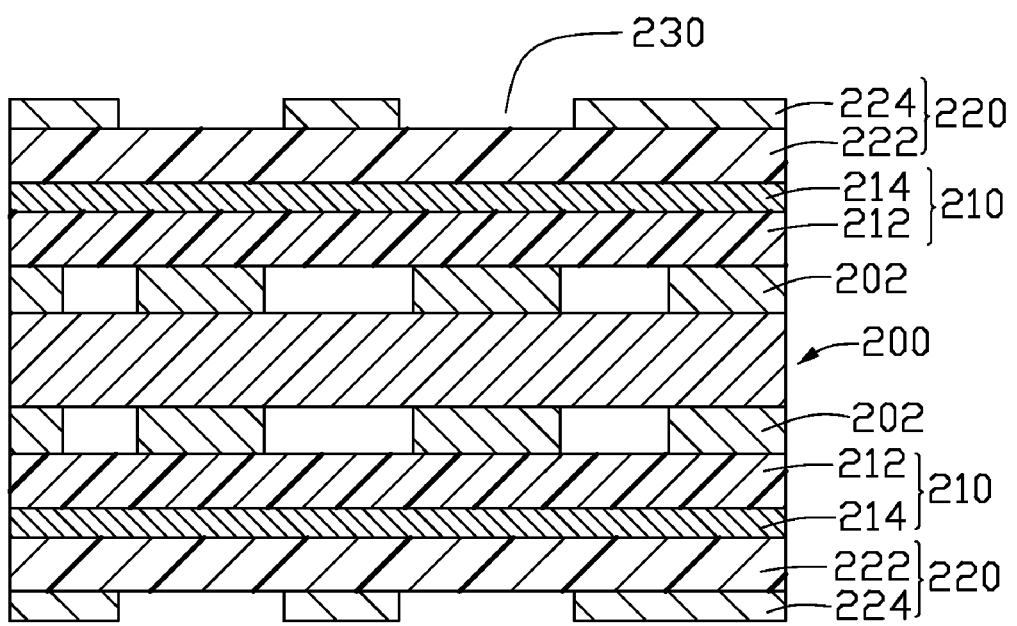

Step 3: referring to FIG. 1C, at least one first window 230 is formed in the second copper layer 224 of the second copper-coated-substrate 220 thereby yielding a residual second copper layer. The at least one first window 230 can be formed using a photolithographic process. The photolithographic process includes the steps of: firstly, cleaning the surface of the second copper layer 224; secondly, coating a photoresist layer such as a liquid photoresist layer or a dry film photoresist layer onto the second copper layer 224; thirdly, exposing the photoresist layer with a photo mask with a predetermined pattern corresponding to position of the at least one first window 230; fourthly, developing (i.e., chemically treating exposed parts) using a developing agent to form a predetermined photoresist pattern corresponding to a predetermined pattern of the photo mask covering the second copper layer 224; fifthly, etching the uncovered parts of the second copper layer 224 corresponding to the at least one first window 230 to form the at least one first window 230 with a copper etchant; finally, removing the residual photoresist layer.

Figure 1D:
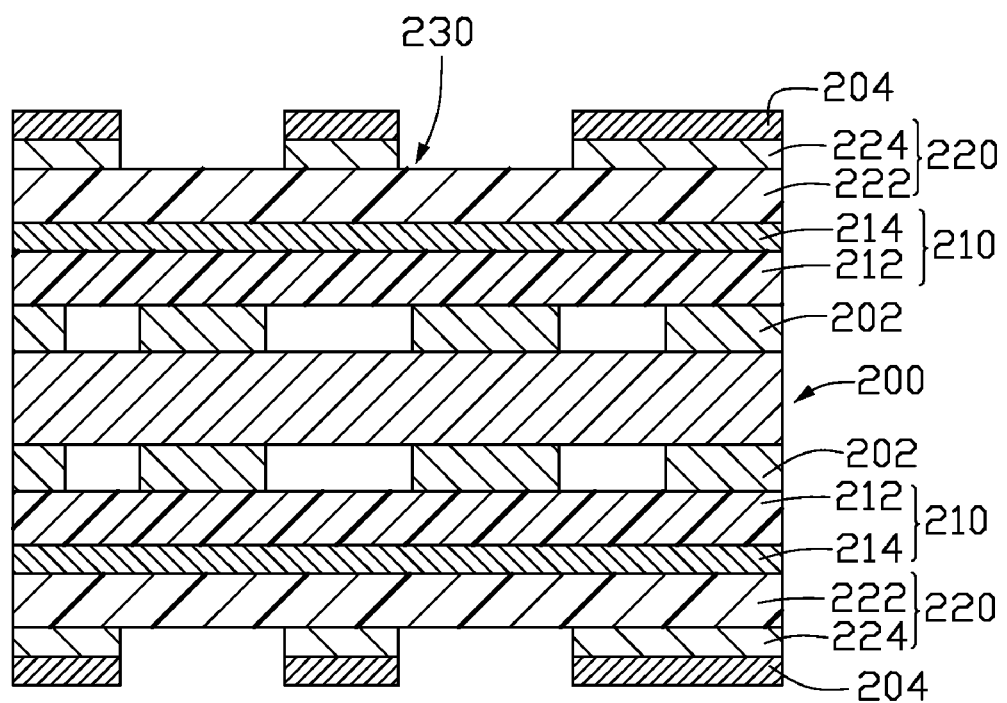

Step 4: referring to FIG. 1D, two protective layers 204 are formed on each of the two residual second copper layers 224. The protective layer 204 can protect the residual region of the second copper layer 224 except for the region positioned corresponding to the at least one first window 230 during the following etching process. The protective layer 204 can be a material selected from a group consisting of metal or resin. The metal material can be tin, nickel, tin-lead alloy or inert metal. In the embodiment, the protective layer 204 is a tin layer.

Figure 1E:
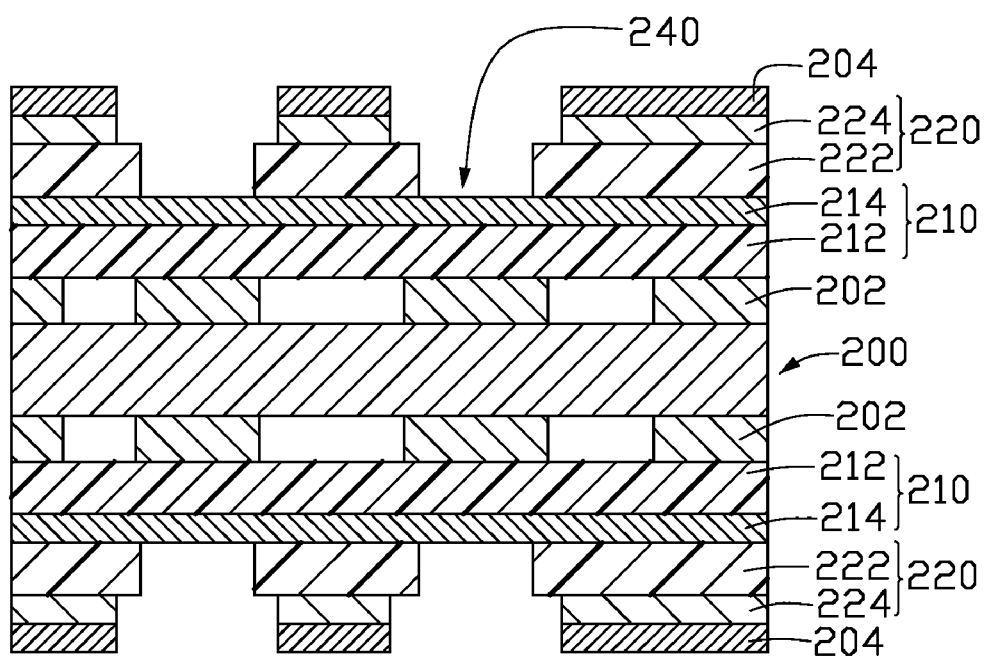

Step 5: referring to FIG. 1E, at least one first hole 240 is made in the second substrate 222 through the at least one first window 230 using a first laser treatment. The first laser treatment can use a dioxide carbon laser. The dioxide carbon laser produces a beam of infrared light with the principal wavelength bands centering around 9.4 and 10.6 micrometers. Therefore, the dioxide carbon laser can only melt and remove the second substrate 222 to form at least one first hole 240 in the second substrate 222, so as to expose the first copper layer 214 corresponding to melting and removing region of the second substrate 222. The at least one first hole 240 can be used for limiting diameter and position of at least one second window 250 (referring to FIG. 1F) formed in later steps, therefore, a diameter of the at least one first hole 240 should be equal to that of the at least one second window 250 formed in later steps. Meanwhile, a diameter of the at least one first hole 240 is also limited by that of the at least one first window 230. The diameter of the at least one first hole 240 should be equal to or less than that of the at least one first window 230. Moreover, the at least one first hole 240 and the at least one first window 230 should be substantially concentric so as to assure that the at least one first window 230 and the at least one second window 250 formed in later steps can be essentially concentric. In the embodiment, the diameter of the at least one first hole 240 is less than that of the at least one first window 230.

Figure 1F:
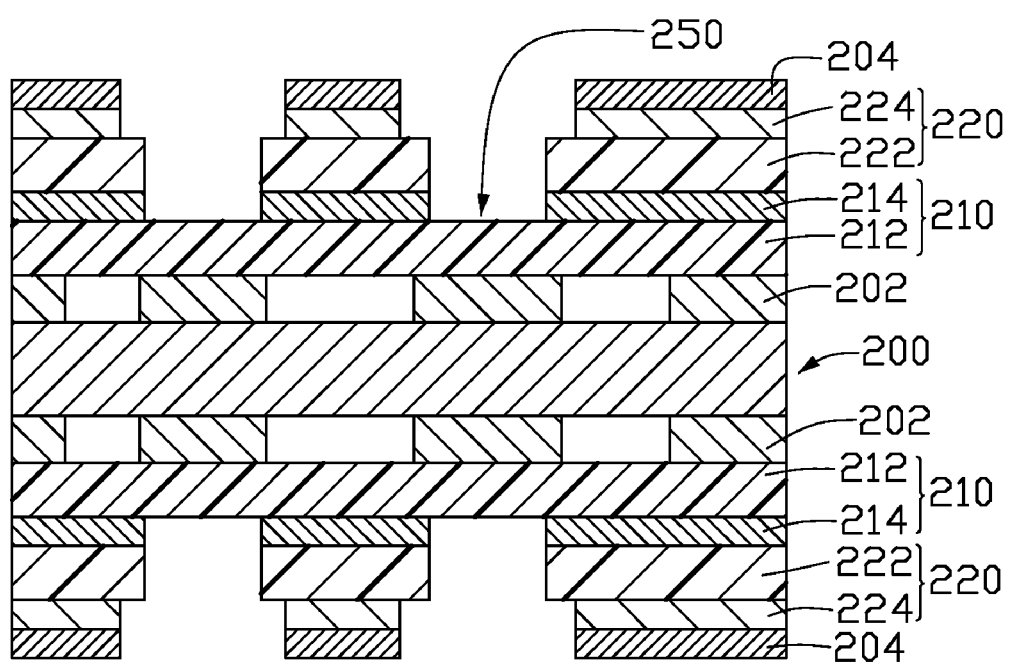

Step 6: referring to FIG. 1F, at least one second window 250 is formed in the first copper layer 214 through the at least one first hole 240. The at least one second window 250 can be formed using an etching process. During the etching process, because the protective layer 204 protects the residual second copper layer 224, only the first copper layer 214 corresponding to the at least one first hole 240 can be etched. Therefore, the at least one second window 250 can be formed in the region defined by the at least one first hole 240. A diameter of the at least one second window 250 can be equal to that of the at least one first hole 240.

Figure 1G:
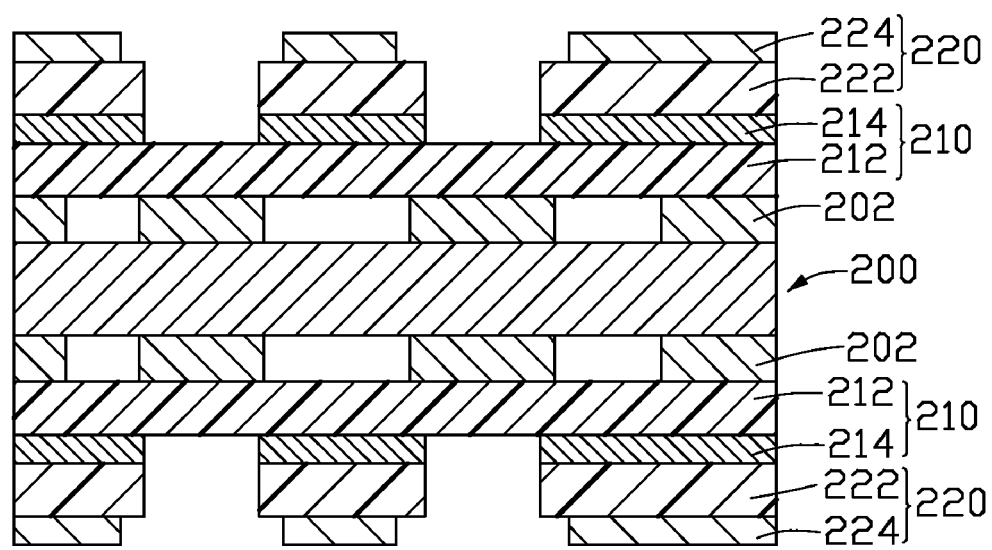

Step 7: referring to FIG. 1G, the protective layer 204 can be removed after the formation of the at least one second window 250.

Figure 1H:
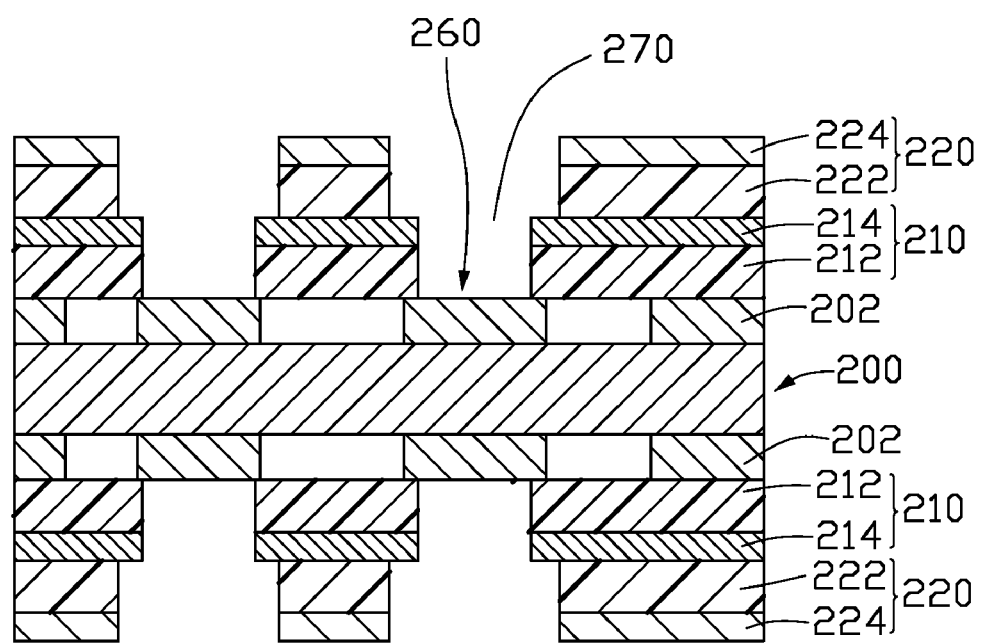

Step 8: referring to FIG. 1H, at least one second hole 260 is made in the first substrate 212 through the at least one second window 250 using a second laser treatment. The second laser treatment also can use a dioxide carbon laser. The first substrate 212 corresponding to the at least one second window 250 is removed by the second laser treatment, thus allowing the at least one first window 230, the at least one first hole 240, the at least one second window 250 and the at least one second hole 260 to cooperatively form at least one part-finished stacked via-hole 270 in the multilayer printed circuit board. The at least one part-finished stacked via-hole 270 is held in position by the at least one first window 230 and the at least one second window 250, thereby preventing positional excursion. Additionally, in the embodiment, because the at least one second window 250 is limited by the at least one first hole 240, the diameter of the at least one first hole 240 is less than that of the at least one first window 230, the residual second substrate 222 corresponding to the at least one first window 230 also should be removed during the second laser treatment. As a result, the at least one part-finished stacked via-hole 270 having two stepped structures can be formed in the multilayer printed circuit board.

Figure 1I:
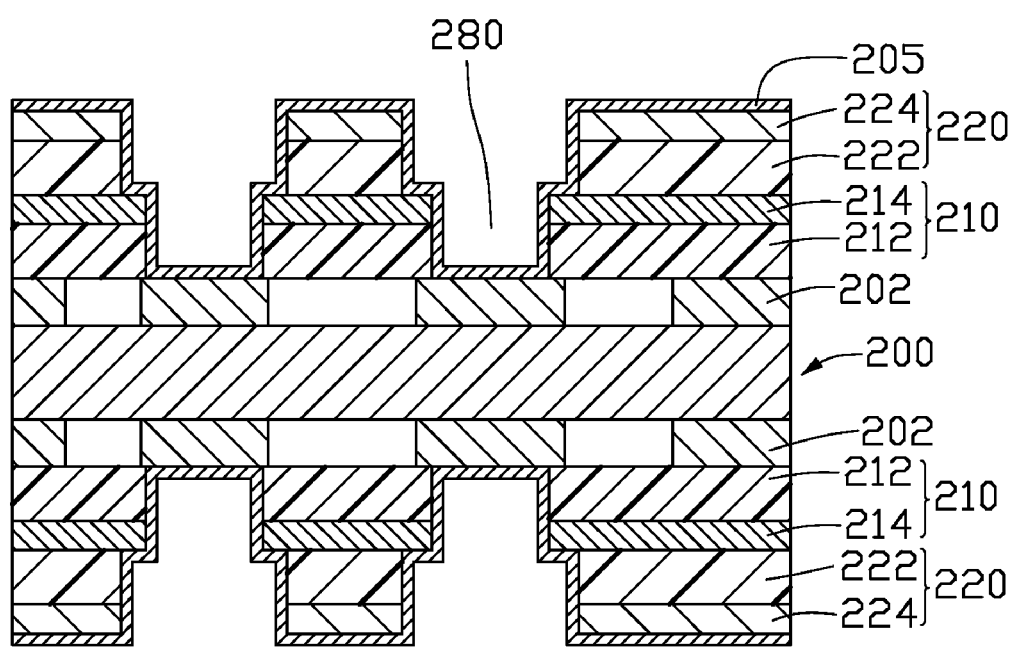

Step 9: referring to FIG. 1I, plating a metal layer 205 such as copper onto an inner surface of the at least one part-finished stacked via-hole 270 is done to form at least one stacked via-hole 280. The at least one stacked via-hole 280 connect the conductive traces from the second copper layer 224 to the first copper layer 214, therefore, in the embodiment, the at least one stacked via-hole 280 is a blind via.

Figure 2A:
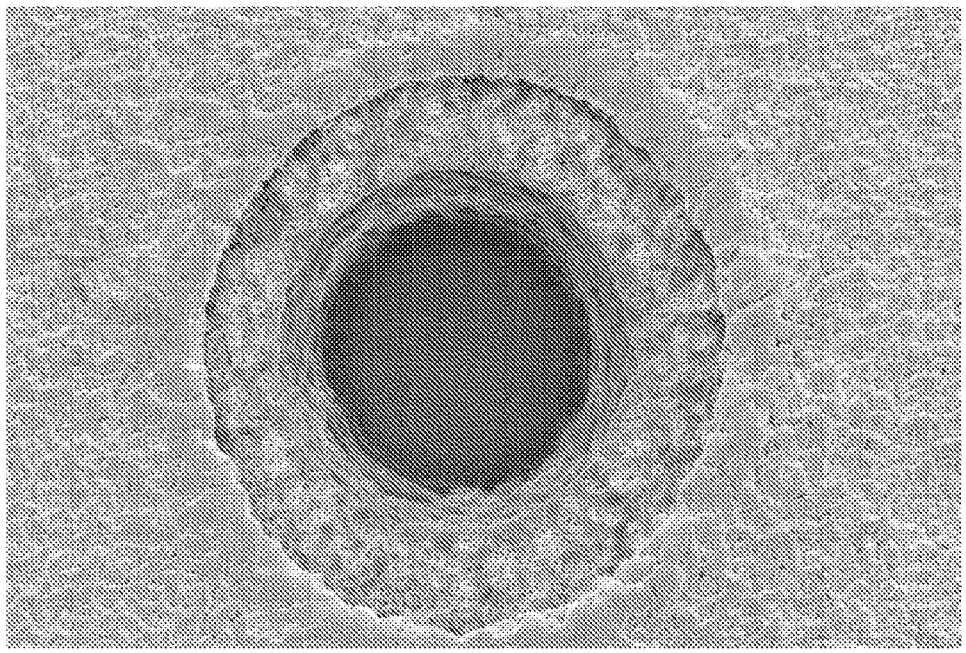
FIG. 2A is a top view of a stacked via-hole before plating using the method according to the preferred embodiment.
Figure 2B:
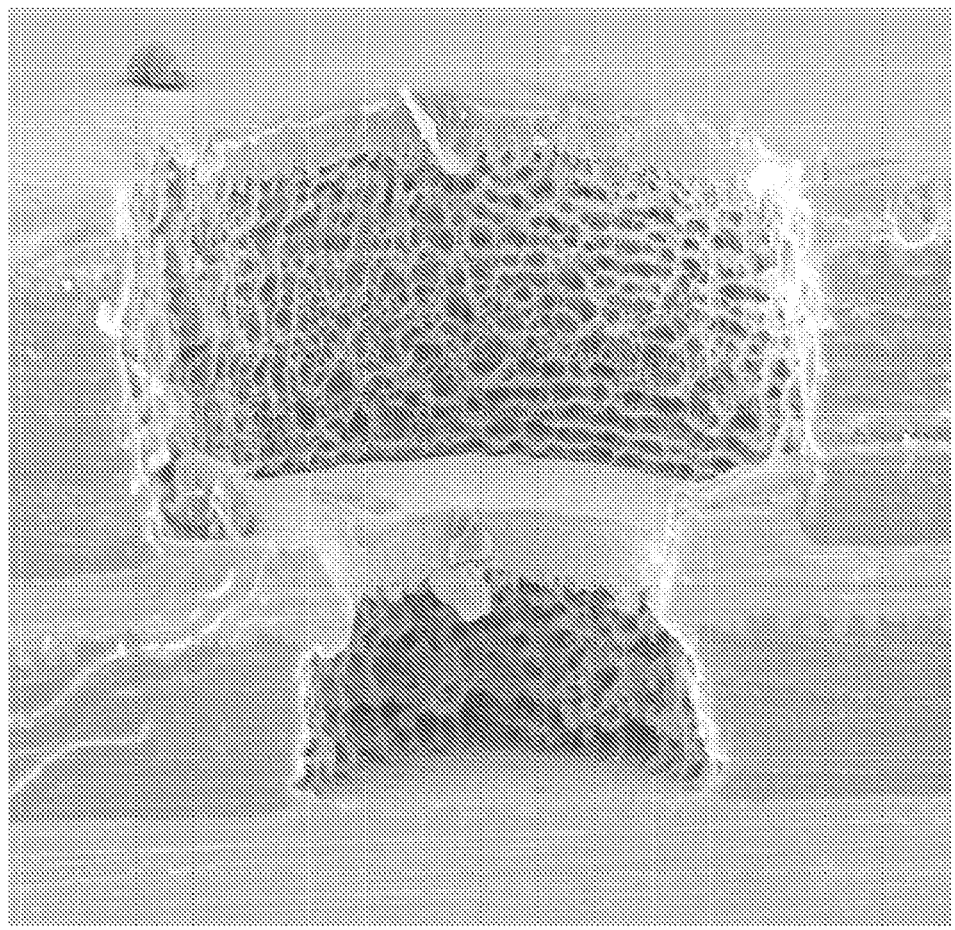
FIG. 2B is a schematic, cross-sectional view of the stacked via-hole of FIG. 2A.
Figure 3:
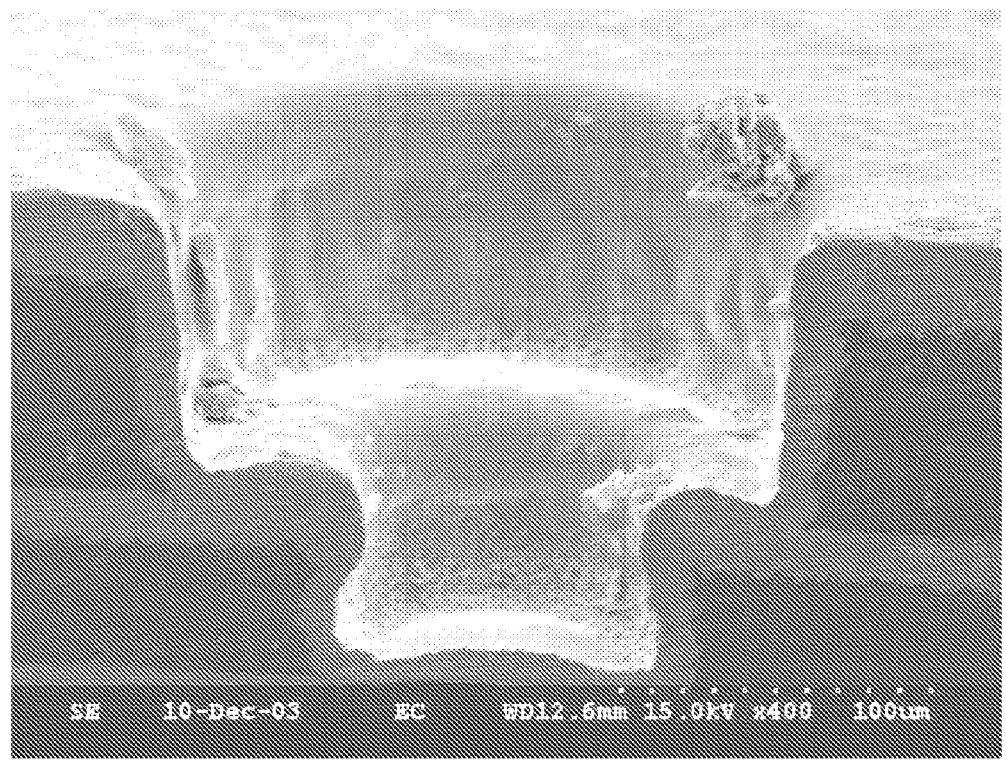
FIG. 3 is a cross-sectional view of a typical stacked via-hole.
Figure 4A:
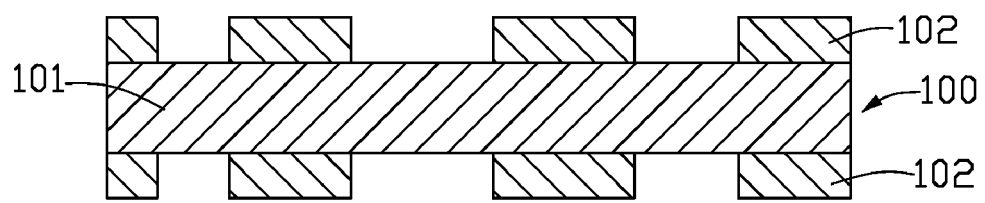
FIGS. 4A-4G are schematic views of successive stages of a typical method for forming stacked via-holes in a multilayer printed circuit board.
Figure 4B:
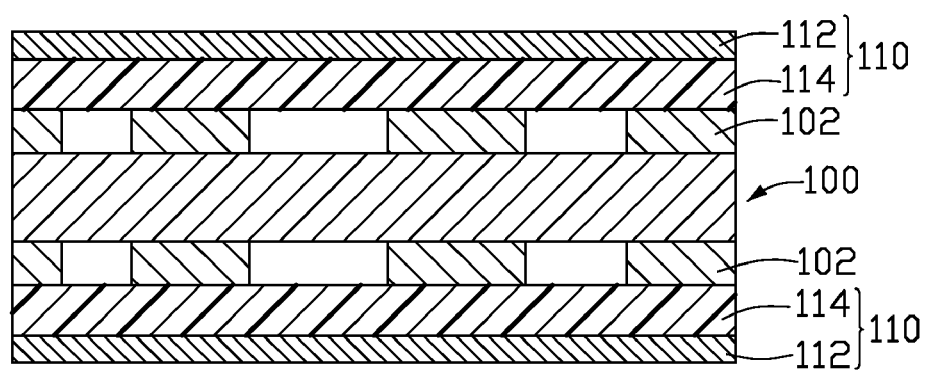
Figure 4C:
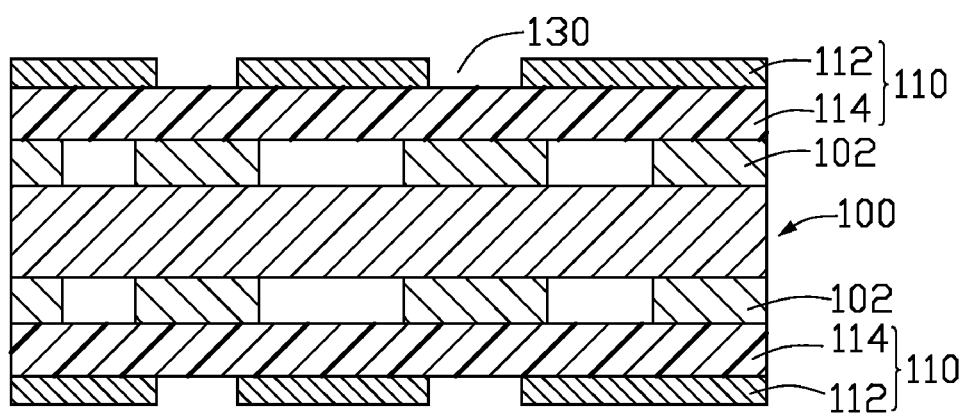
Figure 4D:
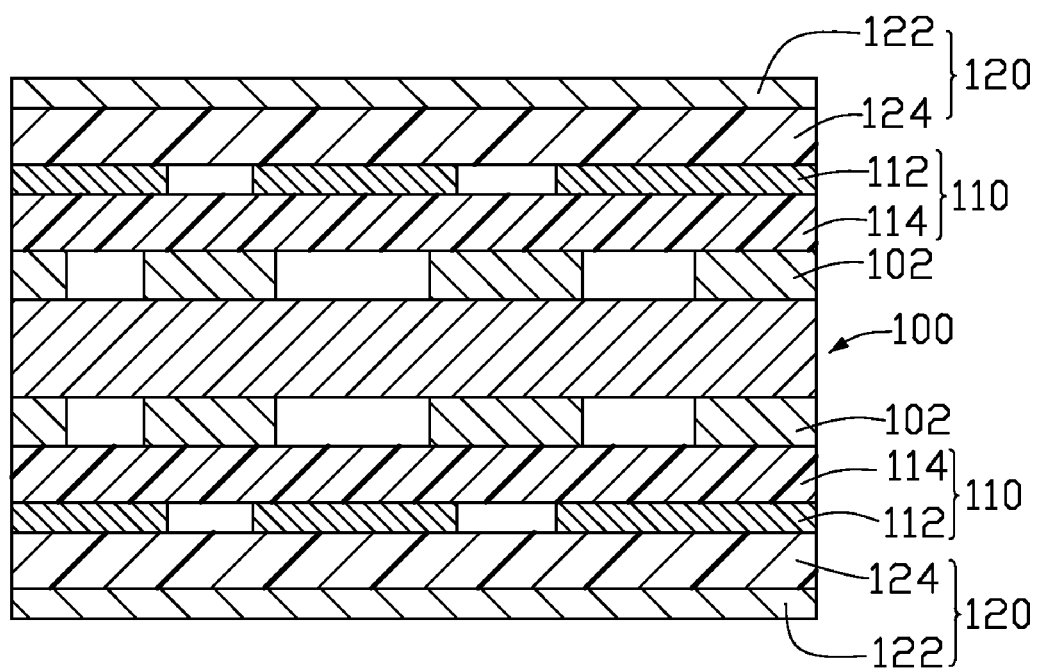
Figure 4E:
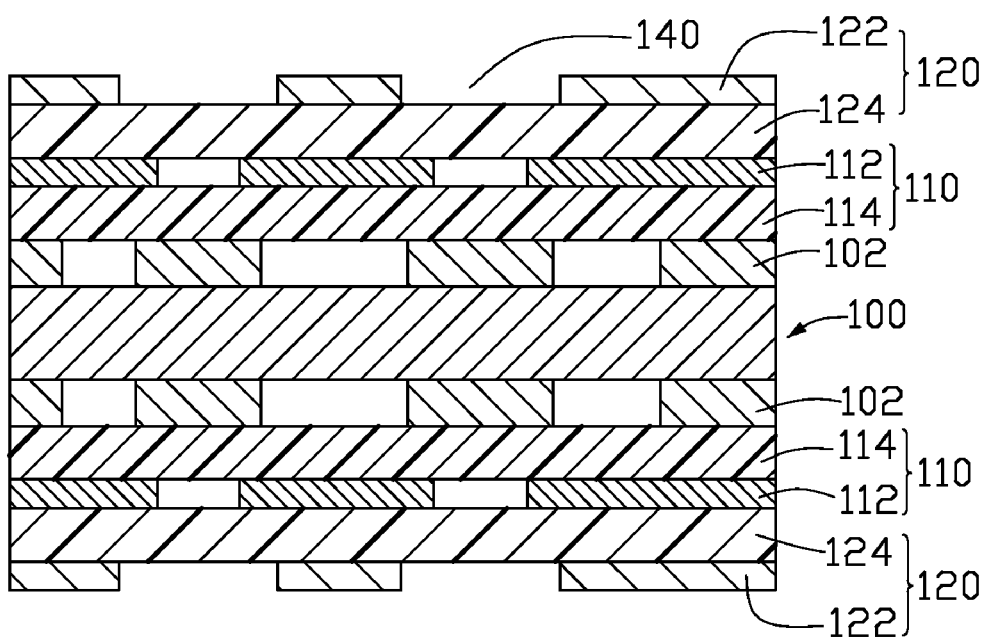
Figure 4F:
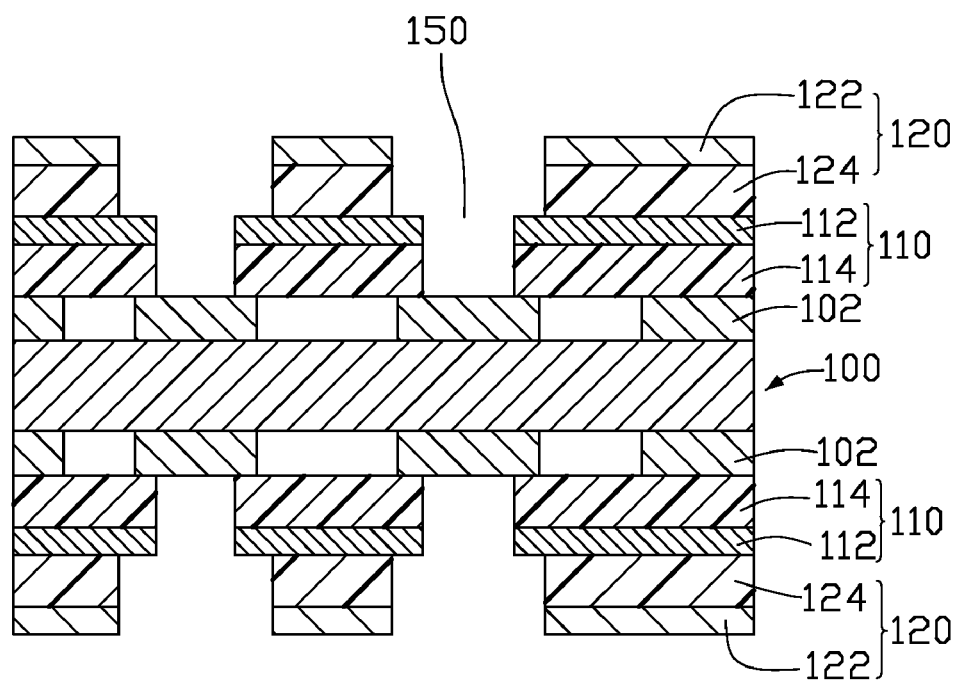
Figure 4G:
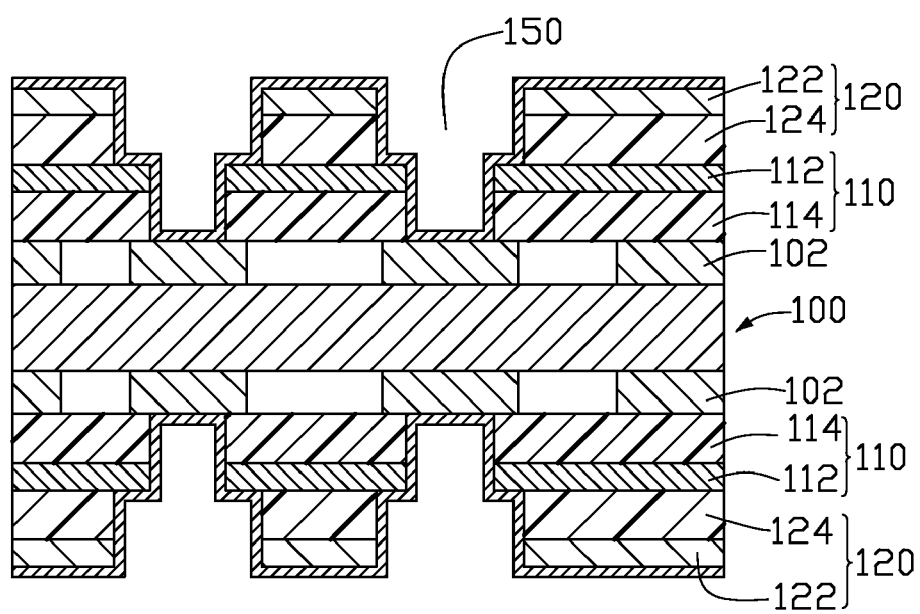
Figure 5A:
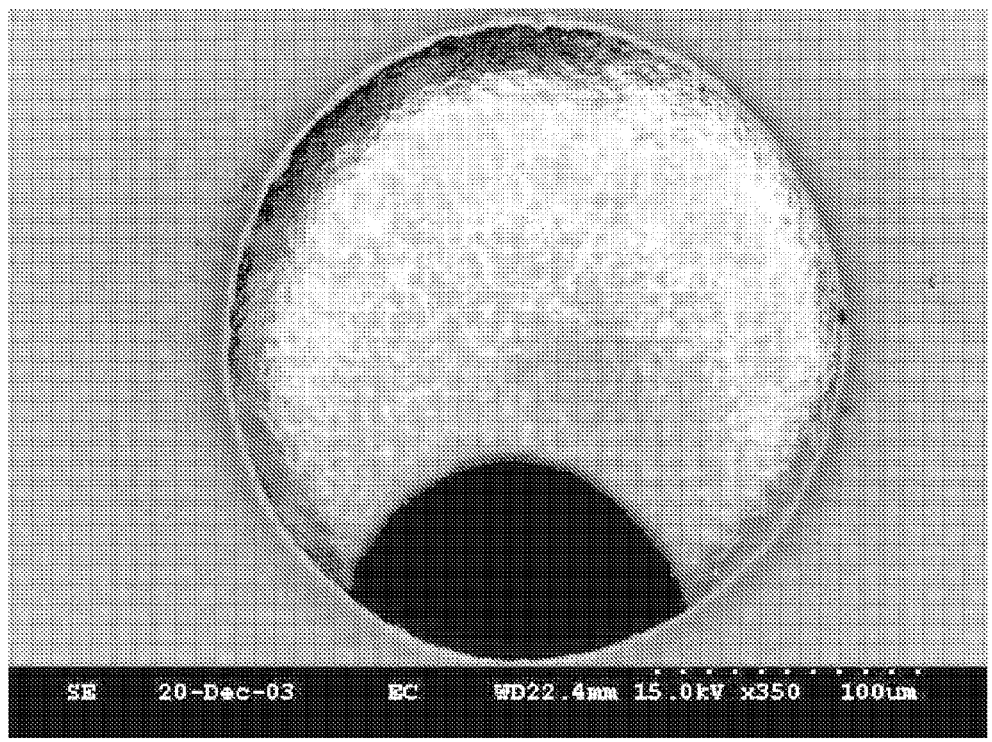
FIG. 5A is a top view of a typical poorly-made stacked via-hole using the typical method for forming stacked via-holes in a multilayer printed circuit board.
Figure 5B:
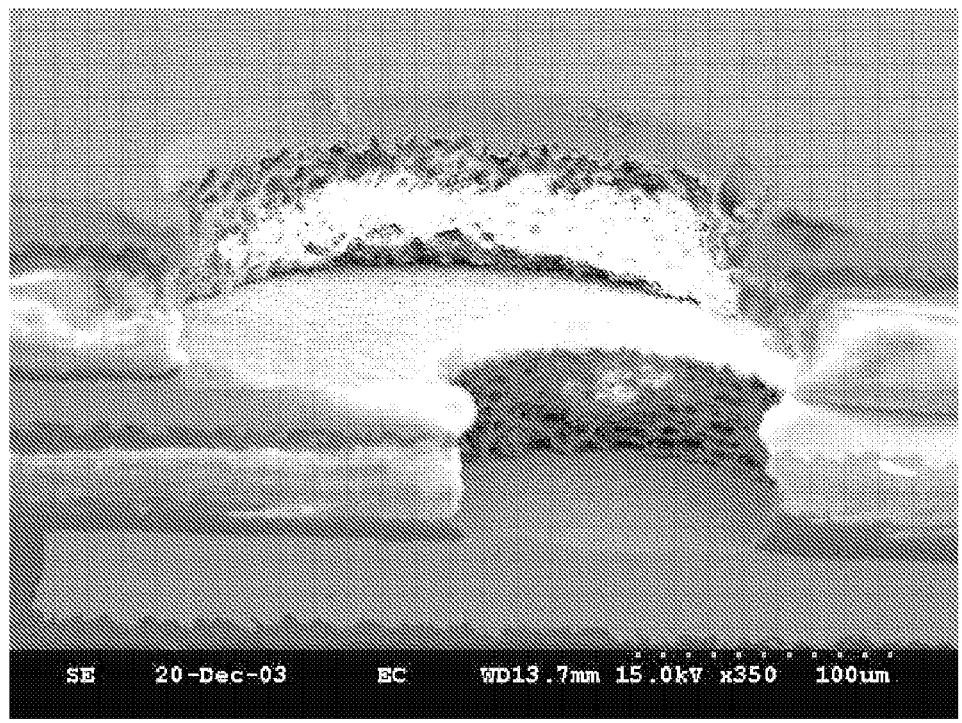
FIG. 5B is a schematic, cross-sectional view of the typical poorly-made stacked via-hole of FIG. 5A.

Referring to FIGS. 2A and 2B, the method of the preferred embodiment can effectively improve quality of stacked via-holes. Stacked via-holes using the method of the preferred embodiment are formed from the second copper-coated-substrate 220 to the first copper-coated-substrate 210, i.e., stacked via-holes are formed from the outermost layer to the inner layer of the multilayer printed circuit board. During the forming process, the at least one first window 230 is used to limit position and diameter of the at least one first hole 240 in the second substrate 222, the at least one first hole 240 is used to limit position and diameter of the at least one second window 250 in the first copper layer 214, the at least one second window 250 is used to limit position and diameter of the at least one second hole 260 in the first substrate 212, and finally at least one stacked via-hole 280 is formed under exact position limitation and diameter limitation. Therefore, possibility of forming poorly-made stack via-holes is greatly decreased. Additionally, stacked via-holes using the method of the preferred embodiment is formed by two laser treatments, thus laser strength can be adjusted according to windows with different diameters and resin with different characteristics thus allowing the production of high-quality stacked via-holes.

In the embodiment, the method of the preferred embodiment is used to form blind vias with stacked structure. The method of the preferred embodiment also can be used to form buried vias with stacked structure. Other copper-coated-substrate can be attached to cover blind vias with stacked structure after formation of blind vias with stacked structure. The method of the preferred embodiment also can be used to form through-hole vias with stacked structure. Otherwise blind vias with stacked structure form at the position of through-hole vias in the base circuit board. Additionally, the method also can be used to form stacked via-holes having more than two stepped structures therein.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope of the appended claims.

What is claimed is:

1. A method for forming stacked via-holes in a multilayer printed circuit board, comprising the steps of:
providing a base circuit board having conductive traces;
attaching a first copper-coated-substrate having a first substrate and a first copper layer thereon and a second copper-coated-substrate having a second substrate and a second copper layer thereon onto the base circuit board in a manner such that the first substrate is brought into contact with the base circuit board and the second substrate is brought into contact with the first copper layer;
forming at least one first window in the second copper layer thereby yielding a residual second copper layer;
forming a protective layer on the residual second copper layer;
making at least one first hole in the second substrate through the at least one first window using a first laser treatment;
forming at least one second window in the first copper layer through the at least first hole;
removing the protective layer;
making at least one second hole in the first substrate through the at least one second window using a second laser treatment, thus allowing the at least first window, the at least first hole, the at least second window and the at least second hole to cooperatively form at least one part-finished stacked via-hole; and
plating a metal layer on an inner surface of the at least one part-finished stacked via-hole thereby forming at least one stacked via-hole.

2. The method as claimed in claim 1, wherein the base circuit board is a single-layer circuit board.

3. The method as claimed in claim 1, wherein the base circuit board is a multilayer circuit board.

4. The method as claimed in claim 1, wherein the first copper-coated-substrate and the second copper-coated-substrate are each selected from a group consisting of resin coated copper foil and prepreg copper-clad foil.

5. The method as claimed in claim 1, wherein the protective layer is comprised of a material selected from a group consisting of metal and resin.

6. The method as claimed in claim 5, wherein the protective layer is comprised of a material selected from a group consisting of tin, nickel, tin-lead and inert metal.

7. The method as claimed in claim 1, wherein the at least one first window is formed using a photolithographic process.

8. The method as claimed in claim 1, wherein the at least one second window is formed using an etching process.

9. The method as claimed in claim 1, wherein a diameter of the at least one first hole is equal to a diameter of the at least one first window.

10. The method as claimed in claim 1, wherein a diameter of the at least one first hole is less than a diameter of the at least one first window.

11. The method as claimed in claim 10, wherein the at least one first hole and the at least one first window are substantially concentric.

12. The method as claimed in claim 1, wherein a diameter of the at least one second window is equal to a diameter of the at least one first hole.

13. The method as claimed in claim 1, wherein the first laser treatment and the second laser treatment are performed using a carbon dioxide laser.

14. The method as claimed in claim 1, wherein the stacked via-hole is a via-hole selected from a group consisting of blind vias, buried vias and through-hole vias.

15. The method as claimed in claim 1, wherein the stacked via-hole is formed with at least two stepped structures therein.

* * * * *